(12) United States Patent
Yang

(10) Patent No.: US 8,622,119 B2
(45) Date of Patent: Jan. 7, 2014

(54) FIXING FRAME AND HEAT DISSIPATION DEVICE USING THE SAME

(75) Inventor: Jian Yang, Shenzhen (CN)

(73) Assignees: Fu Zhun Precision Industry (Shen Zhen) Co., Ltd., Shenzhen (CN); Foxconn Technology Co., Ltd., New Taipei (TW)

(*) Notice: Subject to any disclaimer, the term of this patent is extended or adjusted under 35 U.S.C. 154(b) by 905 days.

(21) Appl. No.: 12/780,956

(22) Filed: May 17, 2010

(65) Prior Publication Data
US 2011/0146948 A1 Jun. 23, 2011

(30) Foreign Application Priority Data
Dec. 18, 2009 (CN) .......................... 2009 1 0311861

(51) Int. Cl.
*H05K 7/20* (2006.01)

(52) U.S. Cl.
USPC ............ 165/185; 165/121; 361/697; 361/704

(58) Field of Classification Search
USPC .................. 165/80.3, 121, 185; 361/697, 704
See application file for complete search history.

(56) References Cited

U.S. PATENT DOCUMENTS

| | | | | |
|---|---|---|---|---|
| 5,495,392 A | * | 2/1996 | Shen | 361/697 |
| 6,304,442 B1 | * | 10/2001 | Tucker et al. | 361/697 |
| 6,407,919 B1 | * | 6/2002 | Chou | 361/697 |
| 6,822,864 B2 | * | 11/2004 | Huang et al. | 361/697 |
| 7,495,921 B2 | * | 2/2009 | Chang et al. | 361/697 |
| 7,532,472 B2 | * | 5/2009 | Lin et al. | 361/697 |
| 8,316,923 B2 | * | 11/2012 | Yang | 165/121 |
| 2010/0103617 A1 | * | 4/2010 | Soma | 361/697 |

* cited by examiner

*Primary Examiner* — Leonard R Leo
(74) *Attorney, Agent, or Firm* — Altis Law Group, Inc.

(57) ABSTRACT

A heat dissipation device includes one of heat sinks with different specifications each of which includes a core and supports extending outwards and radially from the core, and a fixing frame receiving the one of the heat sinks therein. The fixing frame comprises a side plate, a plurality of vertical walls extending downwardly from the side plate, and two sets of slots defined in an inner side of the side plate. Each of the slots extends upwardly from a bottom surface of the side plate to a certain depth to form a step at a top thereof. The slots are staggered with the vertical walls. The supports correspondingly slide in one set of slots and abut corresponding steps.

10 Claims, 4 Drawing Sheets

FIXING FRAME AND HEAT DISSIPATION DEVICE USING THE SAME

BACKGROUND

1. Technical Field

The present disclosure relates to heat dissipation devices, and particularly to a heat dissipation device with a heat sink and a fixing frame adapted for receiving the heat sink.

2. Description of Related Art

With the continuing development of electronics technology, electronic components of electronic devices, such as central processing units (CPUs), memory modules, and video graphics array (VGA) chips, generate much heat in operation. The heat needs to be dissipated efficiently.

Generally, heat sinks combined with cooling fans are used for dissipating heat of such electronic components, to ensure the continued proper functioning of the electronic device. However, in a typical electronic device, the electronic components are of various sizes, and thus the heat sinks usually have different thicknesses. Each type of heat sink needs a particular fixing frame for securing the heat sink and the fan to the corresponding electronic component. Thus, a number of different heat sinks and fixing frames are needed, which adds to the cost of the electronic device.

What is needed, therefore, is a heat dissipation device with a fixing frame to overcome the above-described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
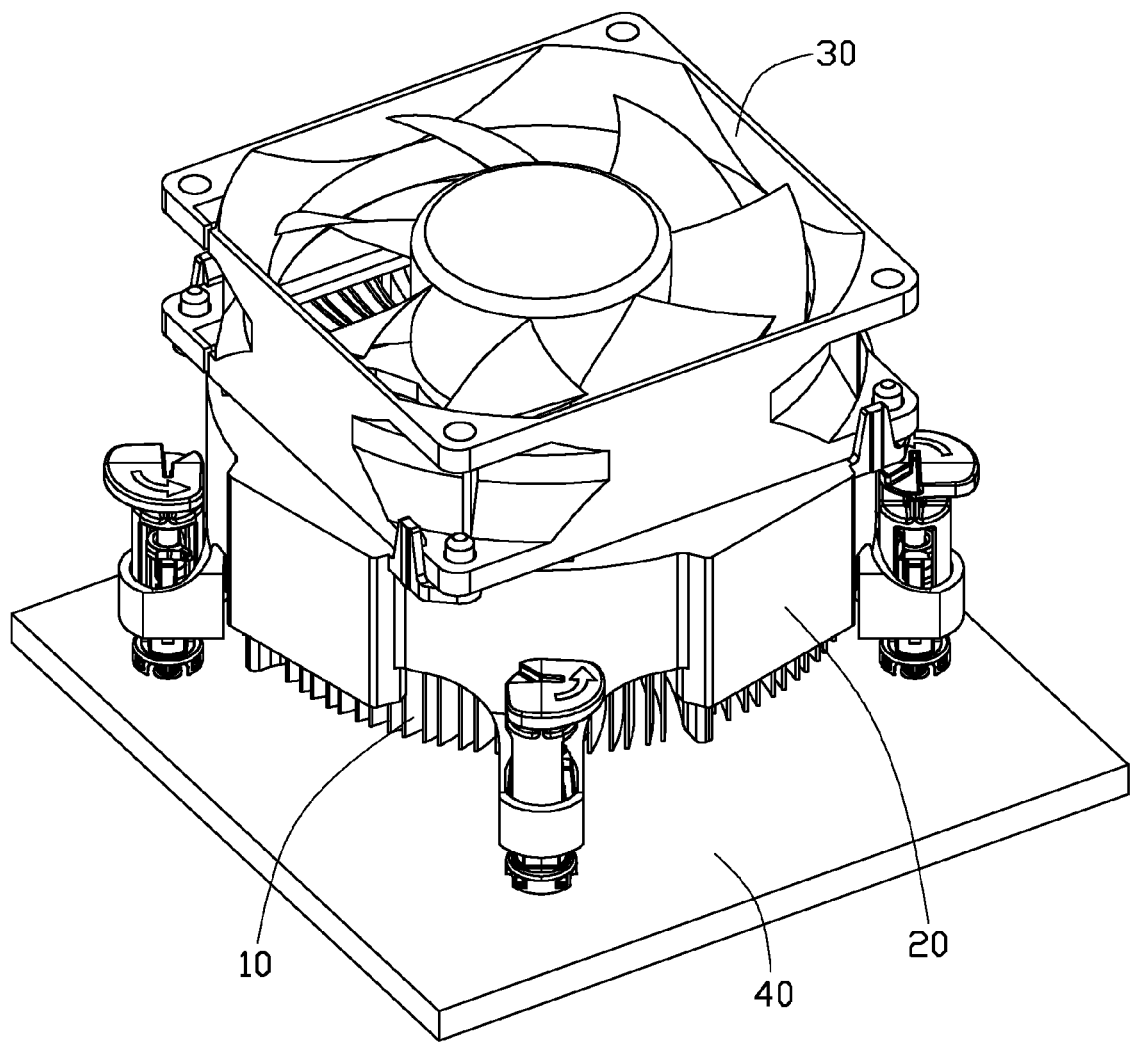
FIG. 1 is an isometric, assembled view of a heat dissipation device in accordance with an embodiment of the disclosure, wherein the heat dissipation device is attached to a heat-generating component mounted on a printed circuit board (PCB).
Figure 2:
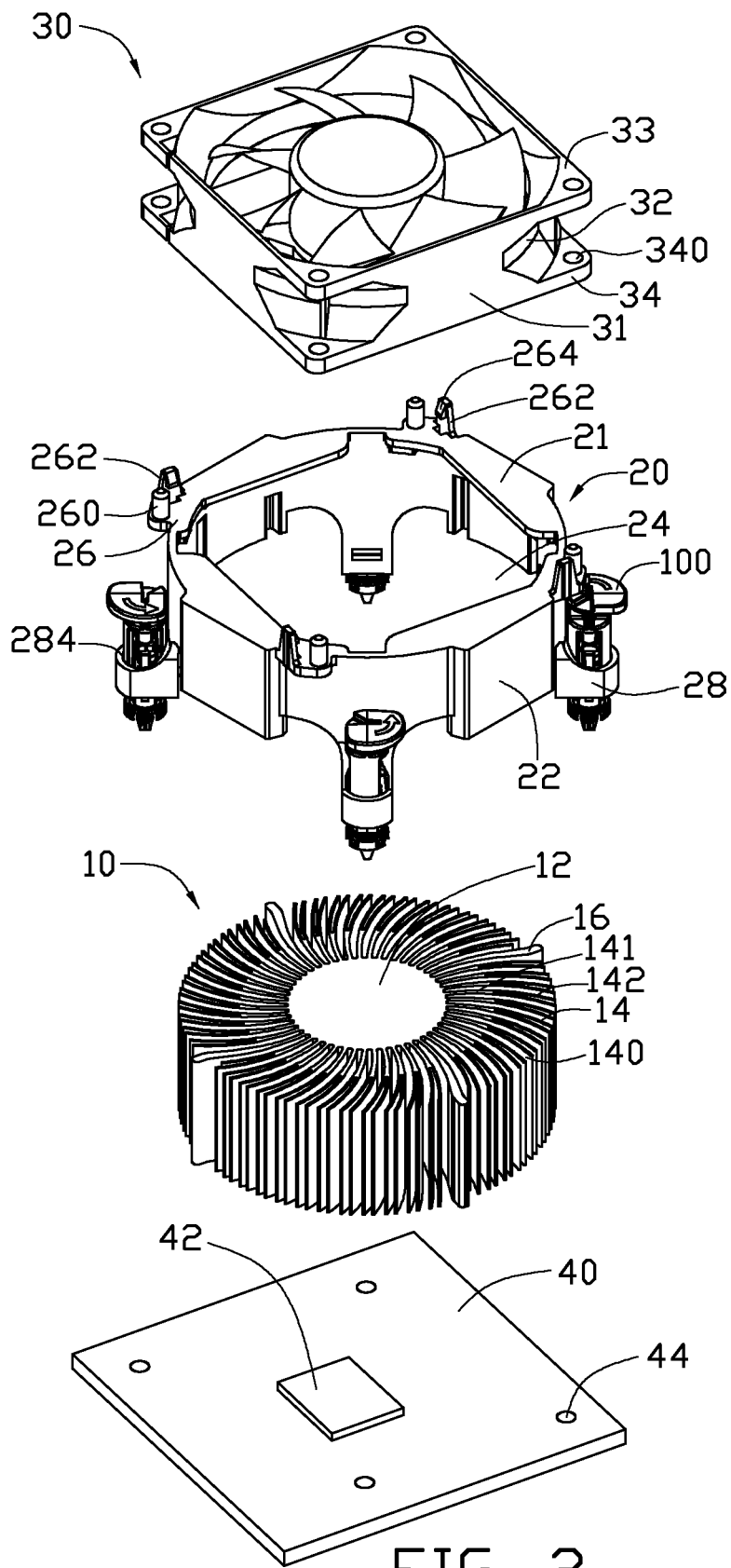
FIG. 2 is an exploded view of the heat dissipation device and the PCB with the heat-generating component of FIG. 1.

Referring to FIGS. 1-2, a heat dissipation device according to an embodiment is disclosed. In the present embodiment, the heat dissipation device is applied for dissipating heat generated by a heat-generating component 42 mounted on a printed circuit board (PCB) 40. The heat dissipation device comprises a heat sink 10 attached to the heat-generating component 42, a fan 30, and a fixing frame 20. The fan 30 is mounted to the heat sink 10 via the fixing frame 20.

The heat sink 10 is substantially cylindrical. The heat sink 10 can be made of a metallic material having good heat conductivity, such as aluminum, copper, etc. The heat sink 10 comprises a cylindrical core 12, four supports 16, and a multiplicity of fins 14. The cylindrical core 12 has a bottom end protruding downwardly beyond an annular bottom face cooperatively defined by bottom ends of the supports 16 and bottom ends of the fins 14. With such configuration, the bottom end of the cylindrical core 12 can make good contact with the heat-generating component 42. The four supports 16 and the fins 14 extend generally radially and outwardly from an outer circumferential surface of the cylindrical core 12. The four supports 16 evenly divide the fins 14 into four sets of fins 14. The supports 16 protrude outwardly beyond outmost ends of the fins 14. That is, the supports 16 are longer than the fins 14, as measured along radial directions of the heat sink 10. Each of the fins 14 comprises an inner portion 141 connected to the outer surface of the cylindrical core 12, and two branches 142 extending outwards from the inner portion 141. A slit 140 is defined between the two branches 142. In the present embodiment, the heat sink 10 is fabricated by extrusion. Each of the supports 16 has a thickness gradually increased along a corresponding generally radial direction of the heat sink 10.

The fins 14 and the supports 16 are all curved, and are all oriented along substantially the same direction relative to the radial directions of the heat sink 10. With this configuration, a surface area of the heat sink 10 is increased. In the present embodiment, the fins 14 and the supports 16 are curved outwards in a generally clockwise direction as viewed from a top of the heat sink 10 in FIG. 2.

The fan 30 comprises a housing 31. The housing 31 comprises an annular sidewall 32, and a top wall 33 and a bottom wall 34 extending outwardly from top and bottom ends of the sidewall 32, respectively. Each of the top and bottom walls 33, 34 has a rectangular outline. Four through holes 340 are defined in four corners of the bottom wall 34, respectively.

The fixing frame 20 is typically made of plastic material, and formed by an integral molding method. Alternatively, the fixing frame 20 can be made of metallic material having high rigidity. The fixing frame 20 comprises a circular top plate 21 defining a square hole 24 at the center thereof, an annular side plate 22 extending downwardly and perpendicularly from an outer periphery of the top plate 21, and four fixing legs 28 extending downwardly from a bottom of the side plate 22. Four ears 26 equally spaced from each other extend outwardly from the outer periphery of the top plate 21. The ears 26 are positioned corresponding to the corners of the square hole 24 of the top plate 21. A mounting post 260 and a fastening arm 262 extend upwardly and perpendicularly from a top surface of each of the ears 26, respectively. The mounting posts 260 correspond to the through holes 340 of the bottom wall 34 of the fan 30, respectively. Each of the fastening arms 262 includes a hook 264 extending inwardly from a top end thereof.

Figure 3:
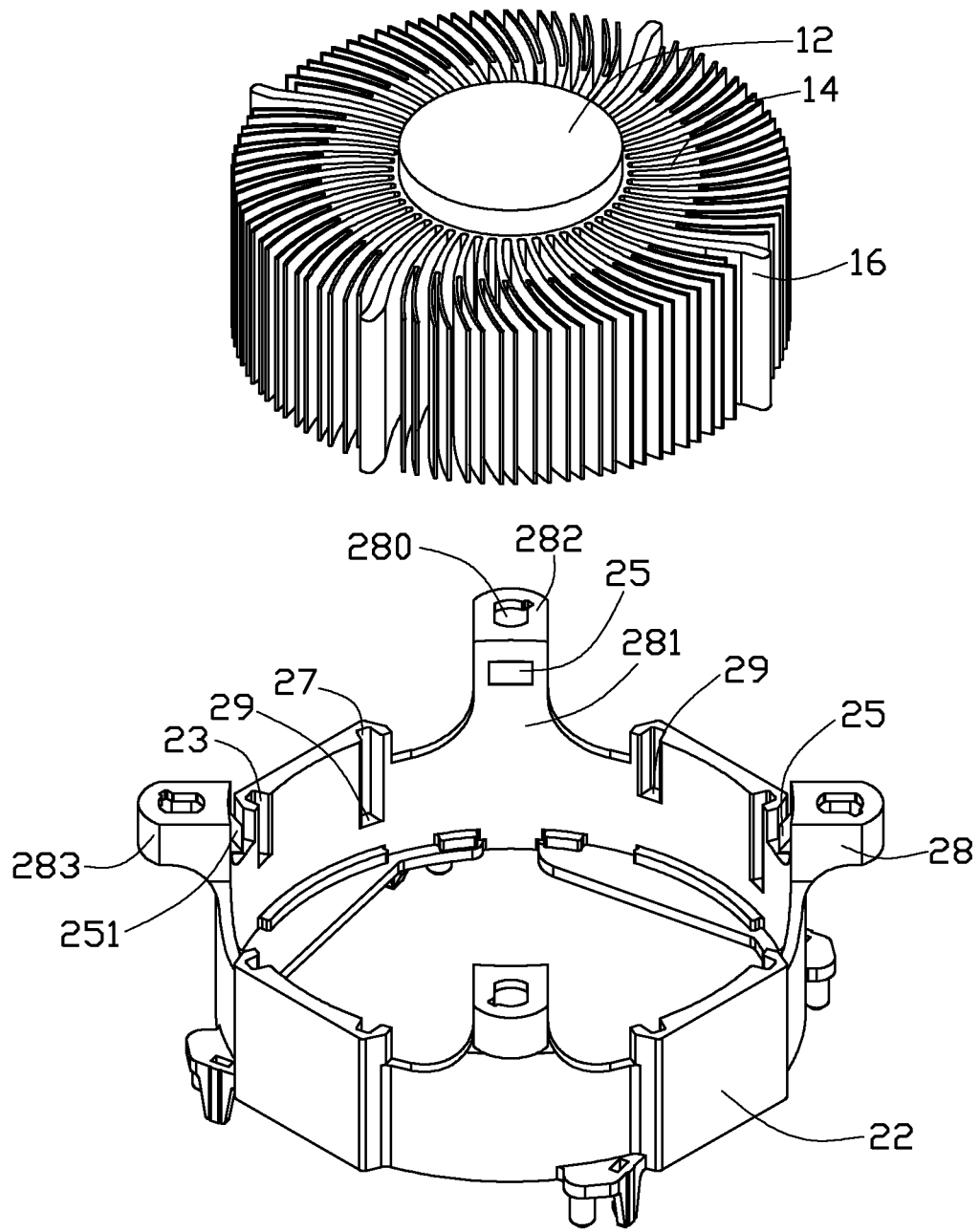
FIG. 3 is an isometric, exploded view of a heat sink and a fixing frame of the heat dissipation device of FIG. 2, showing the heat sink and the fixing frame inverted.

Referring also to FIG. 3, each of the fixing legs 28 comprises a vertical wall 281 extending downwardly from the bottom of the side plate 22, and a horizontal wall 282 extending outwardly and perpendicularly from a bottom end of the vertical wall 281. The vertical wall 281 comprises an inner surface and an outer surface. The inner surfaces of the vertical walls 281 and an inner surface of the side plate 22 are arranged along the same imaginary cylindrical surface. A protruding member 25 extends inwardly from the inner surface of the vertical wall 281 towards a center of the side plate 22. The protruding member 25 has a guiding face 251 inclined inwards and upwards from the inner surface of the vertical wall 281. Each of the horizontal walls 282 defines a hole 280 therein. A circumferential wall 283 extends upwardly from a circumferential edge of the horizontal wall 282, with one side of the circumferential wall 283 also extending from the outer surface of the vertical wall 281. The circumferential wall 283, the horizontal wall 282 and the vertical wall 281 cooperatively define a receiving space 284 (see FIG. 2) for receiving a fastener 100 therein. The receiving spaces 284 communicate with the corresponding holes 280 of the horizontal walls 282.

The side plate 22 of the fixing frame 20 defines two sets of slots in the inner side thereof, being a set of first slots 23 and a set of second slots 27. Each of the first and second slots 23, 27 extends upwardly and perpendicularly from a bottom surface of the side plate 22 towards the top plate 21 of the fixing frame 20. A length of each of the first slots 23 is smaller than a length of each of the second slots 27. The set of first slots 23 has four first slots 23. The four first slots 23 are evenly spaced from each other; that is, the four first slots 23 are evenly arranged along a circumferential direction of the side plate 22. The set of second slots 27 has four second slots 27. The four second slots 27 are evenly spaced from each other; that is, the four second slots 27 are evenly arranged along the circumferential direction of the side plate 22. Each of the first and second slots 23, 27 defines a transverse cross section similar to a transverse cross section of an outmost end of each support 16, so that the outmost end of each support 16 can fit into a selected one of the first and second slots 23, 27. Each of the first and second slots 23, 27 has a step 29 formed at a top end thereof. Each of the first and second slots 23, 27 is spaced from the vertical walls 281 of the fixing legs 28. In particular, the first and second slots 23, 27 are arranged in four pairs, with each pair having one first slot 23 and one second slot 27. The pairs of first and second slots 23, 27 are staggered with respect to the vertical walls 281 of the fixing legs 28.

Figure 4:
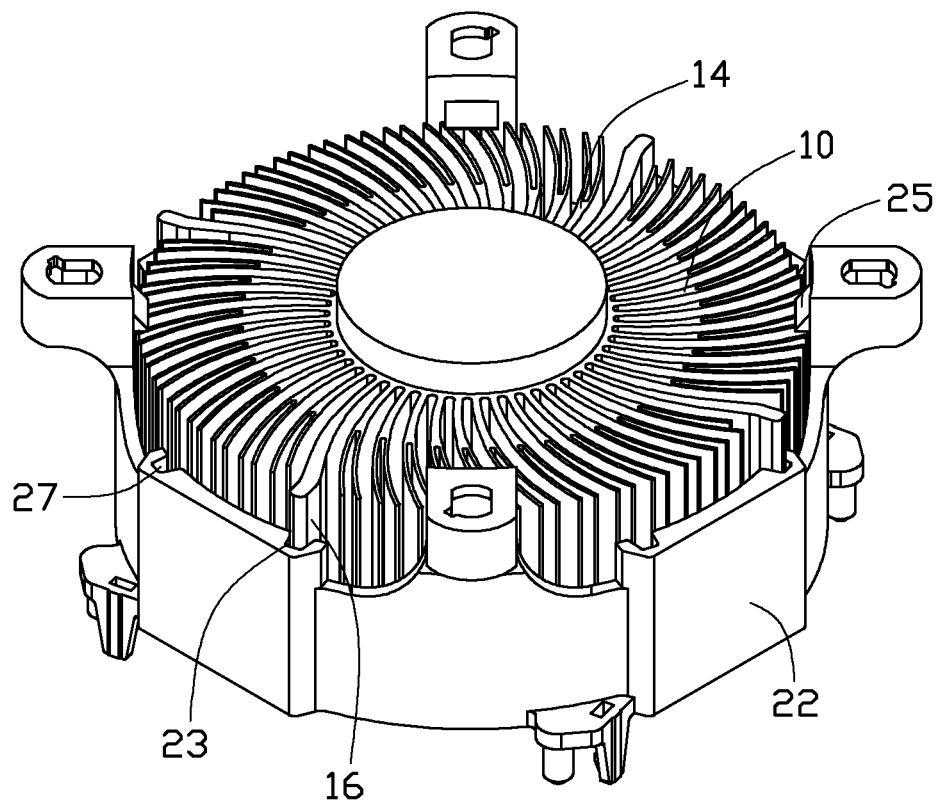
FIG. 4 is an assembled view of the heat sink and the fixing frame of FIG. 3.

Referring also to FIG. 4, when the heat sink 10 and the fixing frame 20 are assembled, both the heat sink 10 and the fixing frame 20 are firstly placed upside-down, with the fins 14 and the supports 16 curved generally counterclockwise as viewed in FIG. 3. The supports 16 correspond to the first slots 23 of the fixing frame 20. At the same time, the fixing legs 28 correspond to the sets of fins 14. The outmost ends of one or more of the fins 14 in each set of fins 14 ride over the guiding faces 251 of the protruding members 25 until top faces of the protruding members 25 abut (or clasp) the annular bottom face of the bottom ends of the supports 16 and fins 14. Simultaneously, the supports 16 slide in the first slots 23 until tops of the outmost ends of the supports 16 abut the steps 29 of the first slots 23. In this position, the heat sink 10 is sandwiched between the protruding members 25 and the steps 29 of the first slots 23.

When the heat sink 10 and the fixing frame 20 are disassembled, a radially outward force is exerted on each of the fixing legs 28. The fixing legs 28 elastically deform until the protruding members 25 move radially outwardly beyond the outmost ends of the fins 14. Then, the heat sink 10 is removed from the fixing frame 20.

Alternatively, the fixing frame 20 can be used with another different heat sink. Typically, the alternative heat sink is the same as the heat sink 10, except that the alternative heat sink is thicker (higher) than the heat sink 10. For example, firstly, the heat sink 10 may need to be detached from the fixing frame 20. Then the outmost ends of one or more of fins in each set of fins of the alternative heat sink ride over the guiding faces 251 of the protruding members 25 until top faces of the protruding members 25 abut (or clasp) an annular bottom face of the bottom ends of supports and the fins of the alternative heat sink. Simultaneously, the supports slide in the second slots 27 until tops of the outmost ends of the supports abut the steps 29 of the second slots 27. In this position, the alternative heat sink is sandwiched between the protruding members 25 and the steps 29 of the second slots 27. The combination of the fixing frame 20 and the alternative heat sink provides a heat dissipation device with a given thickness (height). Such thickness is substantially the same as the thickness of the heat dissipation device constituted by the combination of the fixing frame 20 and the heat sink 10.

In the present embodiment, the side plate 22 defines two sets of slots 23, 27 for selective fitting of either of two heat sinks having different specifications, in particular, different thicknesses. In alternative embodiments, the side plate 22 of the fixing frame 20 can define three or more sets of slots, for selective fitting of any one of three or more corresponding heat sinks having different thicknesses.

Referring back to FIG. 1, the fan 30 is then mounted onto the heat sink 10, with a bottom surface of the bottom wall 34 contacting a top surface of the top plate 21. The mounting posts 260 of the fixing frame 20 are received in the through holes 340 of the bottom wall 34, respectively. The hooks 264 of the fastening arms 262 grasp a periphery of the bottom wall 34 and abut a top surface of the bottom wall 34. Thus, the fan 30 is firmly secured to the combined heat sink 10 and fixing frame 20. Finally, the fasteners 100, such as bolts, are extended through the holes 280 of the fixing legs 28 of the fixing frame 20, to respectively engage into extending holes 44 defined in the printed circuit board 40. Thereby, the heat dissipation device makes good contact with the heat-generating component 42.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device comprising:

a heat sink, which comprises a core and a plurality of supports extending generally radially and outwardly from an outer surface of the core, each support having a height; and a fixing frame receiving the heat sink, the fixing frame comprising:

a side plate encircling the heat sink;

a plurality of vertical walls extending downwardly from a bottom of the side plate; and a set of first slots and a set of second slots defined in an inner side of the side plate, each of the first and second slots extending upwardly from a bottom surface of the side plate and terminating at a step of the inner side, each first slot having a first length, each second slot having a second length different from the first length;

wherein the first and second slots are arranged in a plurality of pairs, with each pair having one first slot and one second slot, the pairs of first and second slots are staggered with respect to the vertical walls;

the height of each support of the heat sink corresponds to one of the first length of each first slot and the second length of each second slot; and the supports of the heat sink are slidingly received in one of the set of first slots and the set of second slots according to whether the height of each support corresponds to the first length of each first slot or the second length of each second slot, with same ends of the supports abutting corresponding steps of the fixing frame.

2. The heat dissipation device of claim 1, further comprising a protruding member extending inwardly from an inner surface of each of the vertical walls of the fixing frame, wherein the protruding members abut a bottom of the heat sink, and the protruding members and the corresponding steps of the fixing frame cooperate with the supports to attach the fixing frame and the heat sink together.

3. The heat dissipation device of claim 1, wherein the first slots and second slots are spaced from each other.

4. The heat dissipation device of claim 1, wherein a cross section defined by each of the first slots and by each of the second slots is substantially the same as a cross section of an outmost end of each of the supports.

5. The heat dissipation device of claim 1, wherein the heat sink further comprises a plurality of fins extending generally radially and outwardly from the outer surface of the core, and the supports of the heat sink are arranged such that the supports evenly divide the fins into a plurality of sets of fins.

6. The heat dissipation device of claim 5, wherein outmost ends of the supports protrude beyond outmost ends of the fins.

7. The heat dissipation device of claim 5, wherein the supports and the fins are all curved, and are all oriented along substantially a same direction relative to radial directions of the heat sink.

8. The heat dissipation device of claim 5, wherein the core of the heat sink has a bottom end protruding downwardly beyond a bottom face cooperatively defined by bottom ends of the supports and bottom ends of the fins.

9. The heat dissipation device of claim 1, wherein each of the supports has a thickness gradually increased along a corresponding radial direction of the heat sink.

10. The heat dissipation device of claim 1, further comprising a fan mounted on the fixing frame, wherein the fan defines a plurality of through holes at corners thereof, the side plate of the fixing frame has a plurality of ears extending outwardly therefrom corresponding to the corners of the fan, and a plurality of mounting posts extend upwardly from the ears and are received in the through holes of the fan.

* * * * *